United States Patent [19]

Han

[11] Patent Number: 5,305,003
[45] Date of Patent: Apr. 19, 1994

[54] TEST DEVICE OF ANALOG/DIGITAL CONVERTER

[75] Inventor: Dae K. Han, Kyungki-Do, Rep. of Korea

[73] Assignee: Goldstar Electron Co., Ltd., Choongchungbook-Do, Rep. of Korea

[21] Appl. No.: 880,772

[22] Filed: May 11, 1992

[30] Foreign Application Priority Data

May 13, 1991 [KR] Rep. of Korea ................. 6771/1991

[51] Int. Cl.$^5$ ............................................. H03M 1/10
[52] U.S. Cl. ........................................ 341/120; 341/155
[58] Field of Search ........................................ 341/120

[56] References Cited

U.S. PATENT DOCUMENTS

| | | | |
|---|---|---|---|
| 4,364,027 | 12/1982 | Murooka | 341/120 |
| 4,612,533 | 9/1986 | Evans | 341/120 |
| 4,763,105 | 8/1988 | Jenq | 341/120 |
| 4,896,282 | 1/1980 | Orwell | 341/120 X |
| 4,937,575 | 6/1990 | Kummer | 341/118 |
| 5,012,241 | 4/1991 | Kuttner | 341/120 |
| 5,053,770 | 10/1991 | Mayer et al. | 341/118 |

Primary Examiner—Marc S. Hoff
Attorney, Agent, or Firm—Lowe, Price, LeBlanc & Becker

[57] ABSTRACT

A test device of an A/D converter contained in a one-chip microcomputer capable of testing all failures in a digital part of the A/D converter by testing the digital part at a function test step carried out by the microcomputer. The test device comprises an A/D test load register for storing a digital value corresponding to an analog value to be tested. In an A/D self-test mode, data from the A/D test load register is stored in an A/D data register via a control logic, upon setting of an A/D start flag. Storing of the data is achieved, in place of an output from a comparator based on an analog input signal. As the data is read, it is possible to test analog and digital parts of the A/D converter individually, at a function test step, thereby verifying all failures in the A/D converter.

15 Claims, 2 Drawing Sheets

TEST DEVICE OF ANALOG/DIGITAL CONVERTER

BACKGROUND OF THE INVENTION

1. Field of the Invention

The present invention relates to an analog/digital converter contained in a one-chip microcomputer and having a self-test function, and more particularly to a test device of an analog/digital converter capable of verifying all failures in a digital part of the analog/digital converter by testing the digital part at a function test step.

2. Description of the Prior Art

Referring to FIG. 1, there is illustrated a conventional test device of an analog/digital converter (A/D converter). As shown in FIG. 1, the test device comprises an analog input select register 1 for storing analog input select data received from a microcomputer via an internal data bus 9 therein, a multiplexer 2 for selecting one of analog input terminals AIN1 to AIN4 on the basis of output data from the select register 1, and a comparator 6 for comparing a selected analog input signal from the multiplexer 2 with a reference signal Vref. The test device also comprises an A/D conversion period register 3 for storing A/D conversion period test data received from the microcomputer via the internal data bus 9 therein. A control logic 4 is also provided for outputting A/D conversion reference data for generating the reference signal Vref and an A/D conversion period signal controlling enabling of the comparator 6, on the basis of the A/D conversion period test data stored in the A/D conversion period register 3. The control logic 4 also functions to convert an output voltage from the comparator 6 into digital data and output it as resultant data. The test device further comprises a D/A converter 7 for converting A/D conversion reference data outputted from the control logic 4 into analog voltage, for each completion of one-bit conversion and supplying each analog voltage to the comparator 6 as the reference voltage Vref, an A/D conversion result register 5 for storing 8-bit digital data outputted sequentially from the control logic 4, and an interrupt generator 8 for generating an interrupt signal upon outputting of A/D conversion data of 8 bits from the control logic 4.

In such a conventional test device, analog input select data inputted from the microcomputer via the internal data bus 9 sequentially stored in the analog input select register 1, as shown in FIG. 1. On the basis of the analog input select data stored in the analog input select register 1, the multiplexer 2 selects one of analog input terminals AIN1 to AIN4 to receive an analog input signal. Analog input signal received in the multiplexer 2 via the selected analog input terminal is applied to the comparator 6 and compared with the reference voltage Vref therein. Resultant signal from the comparator 6 is applied to the control logic 4.

On the other hand, the A/D conversion period select register 3 stores A/D conversion period test data received via the internal data bus 9 from the microcomputer, therein. On the basis of the A/D conversion period test data stored in the A/D conversion period register 3, the control logic 4 generates A/D conversion reference data for generating the reference signal Vref and an A/D conversion period signal controlling enabling of the comparator 6. By the D/A converter 7, A/D conversion reference data outputted from the control logic 4 for each completion of one-bit conversion is converted into an analog voltage which is, in turns, applied to the comparator 6 as the reference voltage Vref.

Accordingly, the comparator 6 compares the analog input signal selected by the multiplexer 2 with the reference voltage Vref and supplies a resultant binary signal to the control logic 4. The binary signal is converted into digital data in the control logic 4 and stored in the A/D conversion result register 5. As such a procedure is repeated 8 times, 8-bit data conversion is completed. Accordingly, 8-bit data from a most significant bit (MSB) to a least significant bit (LSB) is stored in a sequential manner.

Subsequently, the interrupt generator 8 generates an interrupt signal representative of completion of data conversion for 8-bit data from the most significant bit (MSB) to the least significant bit (LSB). At this time, the microcomputer reads the 8-bit data stored in the A/D conversion result register 5 via the internal data bus 9 and verifies analog/digital conversion logic.

However, since the A/D converter contained in microcomputer is a system comprising mixed analog and digital parts requiring a long test time, the conventional test device has a problem of disablement of a lot of logics at a function test step during the entire testing procedure of the microcomputer.

That is, it is impossible to test the comparator 6, a part of the control logic 4, the A/D conversion result register 5 and the D/A converter 7. As a result, it is difficult to verify the defects in the A/D converter contained in the microcomputer in the function test step. Verification for defects in the A/D converter is possible only in an accuracy test step, which requires a long test time and an expensive test cost.

SUMMARY OF THE INVENTION

Therefore, an object of the invention is to provide a test device of an A/D converter contained in a one-chip microcomputer capable of fully testing all failures in a digital part of the A/D converter by testing the digital part at a function test step carried out by the microcomputer.

Another object of the invention is to provide a test device of an A/D converter contained in a one-chip microcomputer capable of detecting analog and digital parts of the A/D converter individually within a short time.

In accordance with the present invention, these objects can be accomplished by providing a test device of an A/D converter contained in a microcomputer comprising: analog processing circuit for selecting an analog input signal, on the basis of analog input select data from the microcomputer, converting reference data into a reference voltage and comparing the selected analog input signal with the reference voltage via a comparator; digital processing circuit for controlling enabling of the comparator on the basis of analog/digital conversion period select data from the microcomputer, outputting the reference data for generating the reference voltage, converting an output signal from the analog processing circuit into digital data, storing the digital data as result data, and generating an interrupt signal after completion of 8-bit data conversion, so as to enable the microcomputer to read the result data; and self-test data loading circuit for setting a self-test mode on the basis of data from the microcomputer, storing self-test data, selecting the self-test data in the self-test mode in place of the output signal from the analog processing circuit, loading the selected self-test data in the digital processing circuit, so as to verify a failure in a digital part of the A/D converter.

BRIEF DESCRIPTION OF THE DRAWINGS

Other objects and aspects of the invention will become apparent from the following description of embodiments with reference to the accompanying drawings in which.

DESCRIPTION OF THE PREFERRED EMBODIMENTS

Figure 1:
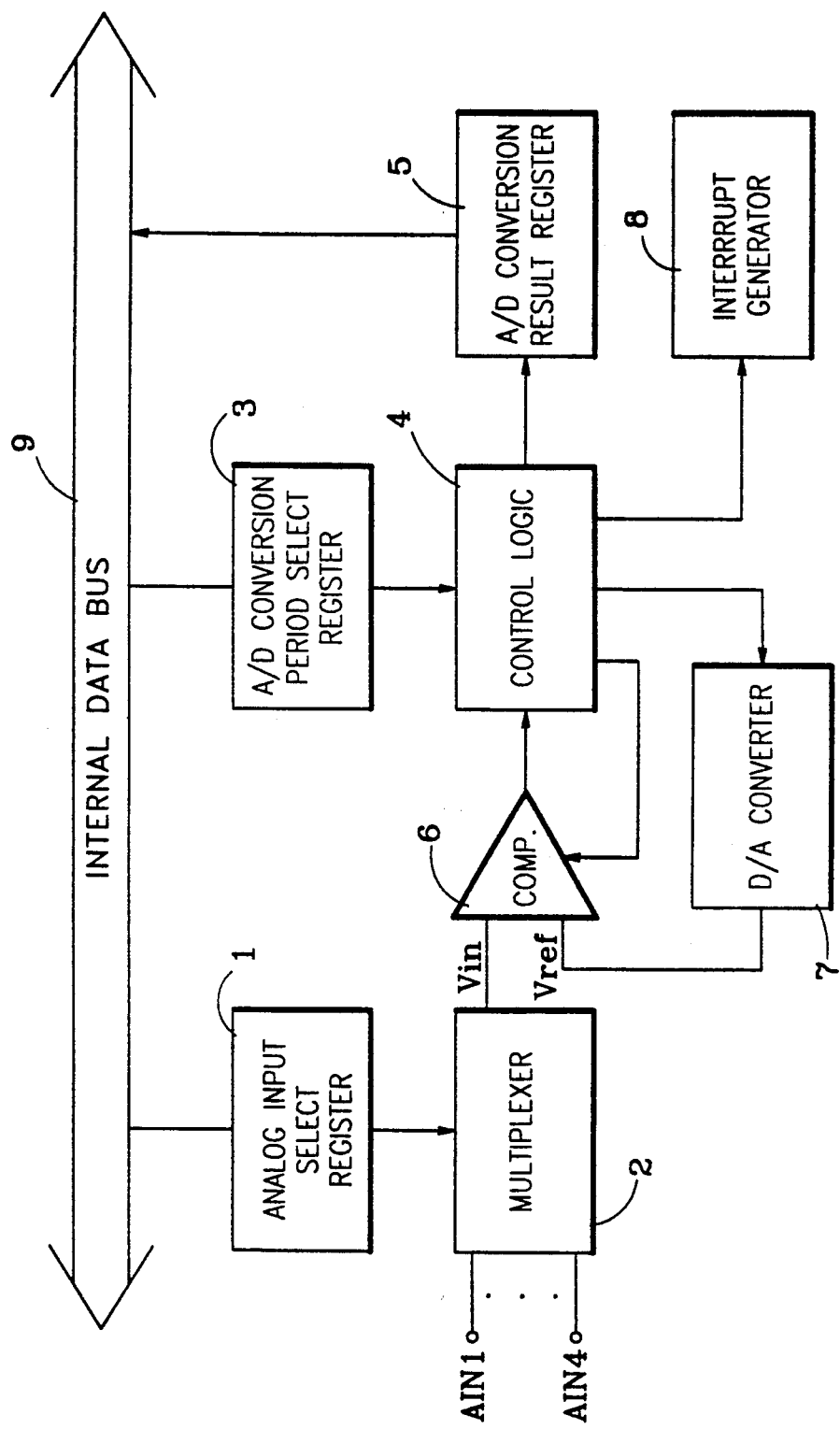
FIG. 1 is a block diagram of a conventional test device of an A/D converter.
Figure 2:
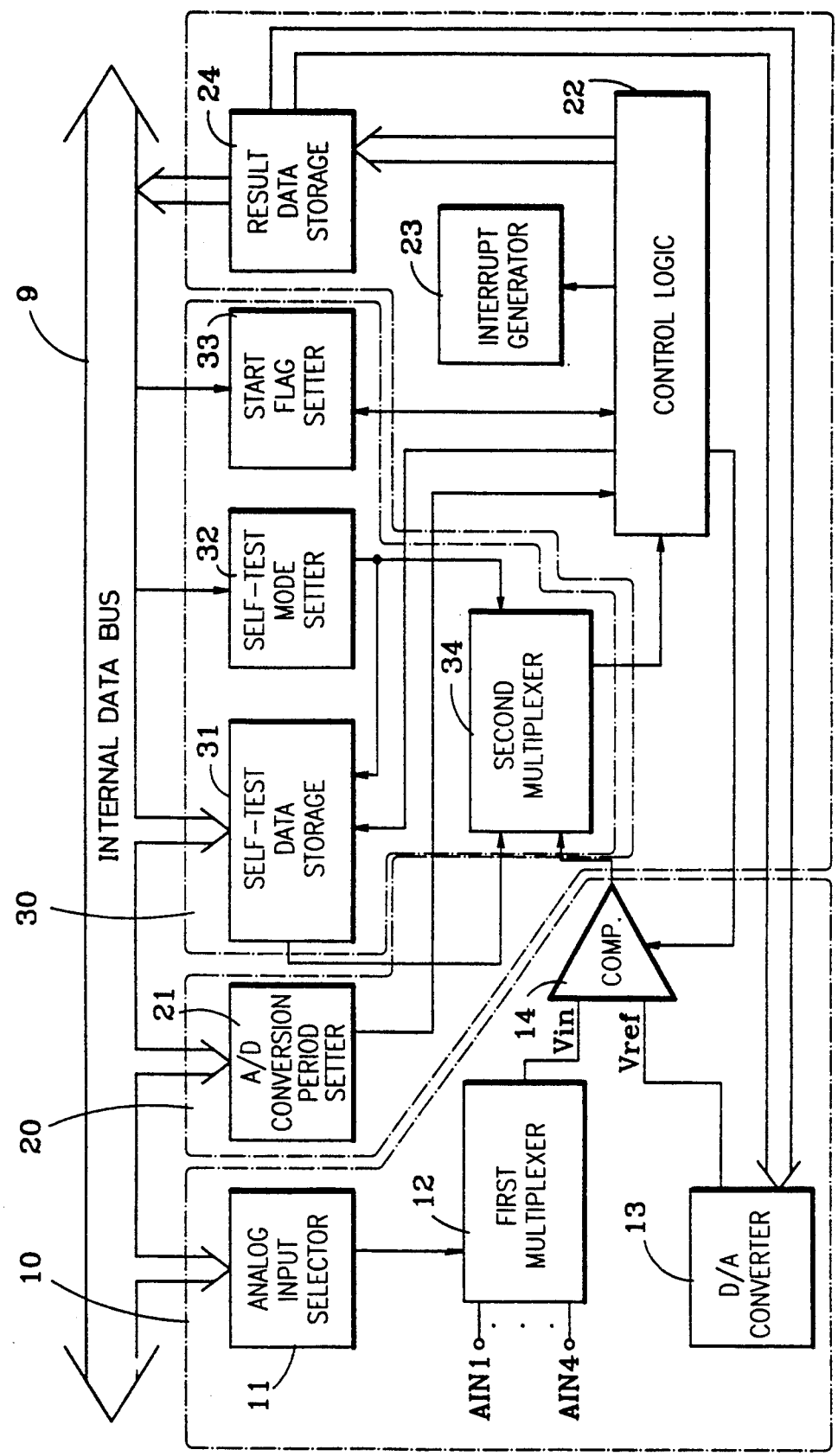
FIG. 2 is a block diagram of a test device of an A/D converter in accordance with the present invention.

FIG. 2 is a block diagram illustrating a test device of an analog/digital converter in accordance with the present invention. As shown in FIG. 2, the test device comprises an analog processing circuit 10 for selecting an analog input signal, on the basis of analog input select data from a microcomputer, converting reference data into a reference voltage Vref and comparing the selected analog input signal with the reference voltage Vref, via a comparator 14. The test device also comprises a digital processing circuit 20 for controlling enabling of the comparator 14 on the basis of analog/digital conversion period select data from the microcomputer, outputting reference data for generating the reference voltage Vref, converting an output signal from the analog processing circuit 10 into digital data, storing the digital data as result data, and generating an interrupt signal after completion of 8-bit data conversion, so as to enable the microcomputer to read the result data. The test device further comprises a self-test data loading circuit 30 for setting a self-test mode on the basis of data from the microcomputer, storing self-test data, selecting the self-test data in the self-test mode in 40 place of the output signal from the analog processing circuit 10, loading the selected self-test data in the digital processing circuit 20, so as to verify failure in a digital part of the A/D converter.

The analog processing circuit 10 includes an analog input selector 11 for storing analog input select data received from the microcomputer via an internal data bus 9 therein, a first multiplexer 12 for selecting one of analog input terminals AIN1 to AIN4 on the basis of output data from the analog input selector 11, a comparator 14 for comparing a selected analog input signal from the multiplexer 12 with the reference signal Vref, and a D/A converter 13 for converting A/D conversion reference data into an analog voltage and outputting the analog voltage to the comparator 14 as the reference voltage Vref.

On the other hand, the digital processing circuit 20 includes an A/D conversion period setter 21 for storing A/D conversion period data received from the microcomputer via the data bus 9, a control logic 22 for outputting a control signal to enable the comparator 14, generating a clock signal to enable the self-test data loading circuit 30 to output the self-test data, converting the self-test data loaded in the digital processing circuit 20 by the self-test data loading circuit 30 or the output signal from the analog processing circuit 10 into digital data and outputting the digital data as A/D conversion result data, an A/D conversion result data storage 24 for storing the A/D conversion result data of 8 bits outputted sequentially from the control logic 22 therein and outputting A/D conversion reference data corresponding to the reference voltage Vref, and an interrupt generator 23 for generating an interrupt signal upon completion of outputting of 8-bit A/D conversion data from the control logic 22.

The self-test data loading circuit 30 includes a self-test mode setter 32 for receiving test mode data from the microcomputer via the internal data bus 9 and setting the self-test mode, a self-test data storage 31 for receiving the clock signal from the control logic 22 of the digital processing circuit 20, storing the self-test data received from the microcomputer via the internal data bus 9 therein and outputting the stored self-test data, a start flag setter 33 for setting a start flag upon receiving an A/D conversion start signal from the microcomputer via the internal data bus 9 and outputting a control signal to the digital processing circuit 20, and a second multiplexer 34 being switchable according to a mode set by the self-test mode setter 32, to select output signal from the comparator 14 or output data from the self-test data storage 31.

Operation of the above-mentioned test device of A/D converter according to the present invention will now be described.

First, a test operation of an analog part of the test device is described.

For the test operation of analog part, first, analog voltages to be tested are outputted from the microcomputer and loaded at analog input terminals AIN1 to AIN4, respectively. At the same time, analog input select data and A/D conversion period select data are outputted from the microcomputer via the internal data bus 9. Thereafter, a test start flag is set.

According to the setting of test start flag, the analog input select data is stored in the analog input selector 11 of the analog processing circuit 10. On the basis of the analog input select data stored in the analog input selector 11, the first multiplexer 12 selects one of analog input terminals AIN1 to AIN4. An analog input signal Vin inputted in the multiplexer 12 via the selected analog input terminal is loaded at one input terminal (−) of the comparator 14. At the other input terminal (+) of the comparator 14, A/D conversion reference data is loaded, which has been converted into an analog reference voltage Vref.

On the other hand, the A/D conversion period select data outputted from the microcomputer via the internal data bus 9 is stored in the A/D conversion period setter 21 of the digital processing circuit 20. On the basis of the A/D conversion period select data, the microcomputer 22 performs an A/D conversion control.

Thereafter, as A/D conversion start data is outputted from the microcomputer, the A/D conversion start flag setter 33 sets a start flag. According to the setting of A/D conversion start flag, the control logic 22 performs the A/D conversion control.

The control logic 22 generates a control signal for enabling the comparator 14 and A/D conversion reference data, on the basis of data from the A/D conversion period setter 21. The A/D conversion reference data is received in the D/A converter 13 and converted into an analog reference voltage Vref which, in turns, is loaded at the other input terminal (+) of the comparator 14. The comparator 14 enables by the enable control signal from the control logic 22 and thus compares the analog input signal Vin with the analog reference voltage Vref.

Resultant signal from the comparator 14 is applied to one input terminal of the second multiplexer 34. The second multiplexer 34 is switched according to a mode set by the self-test mode setter 32, to select output signal from the comparator 14 or output data from the self-test data storage 31. In modes other than the self-test mode, the second multiplexer 34 selects the output signal from the comparator 14 and applies it to the control logic 22. In the control logic 22, the signal inputted from the second multiplexer 34 is converted into digital data which is, in turns, supplied to the A/D conversion result data storage 24.

In such a procedure, the control logic 22 performs the A/D conversion control for each bit. Resultant data, that is, A/D conversion result data is stored in the A/D conversion result data storage 24. Upon completion of 8-bit data conversion, an interrupt signal is generated in the interrupt generator 23. By the interrupt signal, the microcomputer reads the A/D conversion result data stored in the A/D conversion result data and discriminates whether the read digital data corresponds to the analog voltage loaded at the selected analog input terminal, so as to test the analog part of A/D converter.

Now, a test operation of the digital part of test device will be described.

For self-testing the digital part of A/D converter, first, the microcomputer outputs A/D conversion period select data, A/D conversion self-test data and self-test mode setting data, via the internal data bus 9, and sets a start flag.

As a result, the A/D conversion period select data is stored in the A/D conversion period setter 21 of the digital processing circuit 20. On the other hand, the self-test mode setting data is applied to the self-test mode setter 32, to set the self-test mode therein. According to the setting of the self-test mode, the A/D conversion self-test data is stored in the A/D conversion self-test data storage 31. The self-test data is a digital value corresponding to the level of the analog voltage to be tested.

Then, the microcomputer outputs data commanding to start the self-test, to the start flag setter 33, so as to set a start flag therein. According to the setting of the start flag, the control logic 22 of the digital processing circuit 20 controls the self-test operation of the digital part.

That is, the control logic 22 outputs a clock signal for data transmission to the self-test storage 31. In synchronous with the clock signal, the A/D conversion self-test data stored in the A/D conversion self-test data storage 31 is loaded in the second multiplexer 34. Under the control of the self-test mode setter 32, the second multiplexer 34 selects the A/D conversion self-test data outputted from the A/D conversion self-test data storage 31 and applies it to the control logic 22. The control logic 22 converts the signal inputted from the second multiplexer 34 into digital data and applies it to the A/D conversion result data storage 24.

As the above procedure is repeated 8 times, 8-bit data conversion is completed. In response to the completion of 8-bit data conversion, the interrupt generator 23 generates an interrupt signal. In response to the interrupt signal, the microcomputer reads the A/D conversion result data stored in the A/D conversion result storage 24 and then compares the read data with the A/D conversion self-test data loaded as above-mentioned, to detect a possible failure of the digital part of A/D converter.

Where the A/D self-test data stored in the self-test data storage 31 is data having various patterns, all possible failures of the digital part can be detected by repeating the above procedure. By carrying out the above procedure together with the test procedure for the analog part, the entire test of A/D conversion logic can be possible.

As apparent from the above description, the present invention provides a test device of an A/D converter contained in an one-chip microcomputer capable of fully testing all failures in a digital part of the A/D converter by testing the digital part at a function test step carried out by the microcomputer, thereby reducing a test time. The test device has also an advantage of enabling an efficient test, in that it verifies all failures in the digital part, prior to an accuracy test for the A/D converter.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A test device of an A/D converter contained in a microcomputer comprising:
    a) analog processing means for selecting an analog input signal, on the basis of analog input select data from the microcomputer, converting reference data into a reference voltage and comparing the selected analog input signal with the reference voltage via a comparator;
    b) digital processing means for controlling enabling of the comparator on the basis of analog/digital conversion period select data from the microcomputer, outputting the reference data for generating the reference voltage, converting an output signal from the analog processing means into digital data, storing the digital data as result data, and generating an interrupt signal after completion of 8-bit conversion, so as to enable the microcomputer to read the result data; and
    c) self-test data loading means for setting a self-test mode on the basis of data from the microcomputer, storing self-test data, selecting the self-test data in the self-test mode in place of the output signal from the analog processing means, loading the selected self-test data in the digital processing means, so as to verify a failure in a digital part of the A/D converter, wherein the self-test data loading means comprises
        i) a self-test mode setter for receiving test mode data from the microcomputer via the internal data bus and setting the self-test mode,
        ii) a self-test data storage for receiving the clock signal from the control logic of the digital processing means, storing the self-test data received from the microcomputer via the internal data bus therein and outputting the stored self-test data,
        iii) a start flag setter for setting a start flag upon receiving an A/D conversion start signal from the microcomputer via the internal data bus and outputting a control signal to the digital processing circuit and
        iv) a second multiplexer being switchable according to a mode set by the self-test mode setter, to select output signal from the comparator or output data from the self-test data storage.

2. A test device of an A/D converter contained in a microcomputer in accordance with claim 1, wherein the analog processing means comprises:

an analog input selector for storing analog input select data received from the microcomputer via an internal data bus therein;

a first multiplexer for selecting one of analog input terminals on the basis of output data from the analog input selector;

the comparator for comparing a selected analog input signal from the multiplexer with the reference signal; and a D/A converter for converting A/D conversion reference data into an analog voltage and outputting the analog voltage to the comparator as the reference voltage.

3. A test device of an A/D converter contained in a microcomputer in accordance with claim 1, wherein the digital processing means comprises:

an A/D conversion period setter for storing A/D conversion period data received from the microcomputer via the data bus;

a control logic for outputting a control signal to enable the comparator, generating a clock signal to enable the self-test data loading circuit to output the self-test data, converting the self-test data loaded in the digital processing means by the self-test data loading means or the output signal from the analog processing means into digital data and outputting the digital data as A/D conversion result data;

an A/D conversion result data storage for storing the A/D conversion result data of 8 bits outputted sequentially from the control logic therein and outputting A/D conversion reference data corresponding to the reference voltage Vref; and an interrupt generator for generating an interrupt signal upon completion of outputting of 8-bit A/D conversion data from the control logic.

4. A test device of an analog-to-digital converter contained in a microcomputer comprising:

a) analog processing means for comparing an input signal from the microcomputer with a reference signal based upon data from the microcomputer;

b) digital processing means, coupled to said analog processing means, for converting an output signal based on the comparison of the input signal and the reference signal into digital data; and c) self-test data loading means, coupled to said analog and digital processing means, for testing failures in digital parts of the analog-to-digital converter by comparing self-test data with self-test data which said digital processing means has converted into the digital data in place of the output signal from said analog processing means, wherein said self-test data loading means comprises i) a self-test mode setter for storing test mode data from the microcomputer, and ii) a start flag setter for setting a start flag upon receiving a start signal from the microcomputer and outputting a control signal to said digital processing means.

5. The test device of claim 4, wherein said analog processing means comprises:

an analog input selector for storing analog input select data received from the microcomputer;

a first multiplexer for selecting one of a plurality of input signals at input terminals of said first multiplexer in accordance with the analog input select data;

a digital-to-analog converter for converting reference data from said digital processing means into the reference signal; and a comparator for comparing the input signal with the reference signal.

6. The test device of claim 4, wherein said digital processing means comprises:

an A/D conversion period setter for storing A/D conversion period data from the microcomputer; and a control logic for generating control signals to enable said analog processing means and said self-test data loading means, said control logic converting the A/D conversion period data into reference data used for the reference signal and converting the self-test data from said self-test data loading means or the output signal from said analog processing means into digital data.

7. The test device of claim 6, wherein said digital processing means further comprises:

an A/D conversion result data storage for storing the digital data as A/D conversion result data and the reference data; and an interrupt generator for generating an interrupt signal upon completion of storing the digital data as A/D conversion result data in said A/D conversion result data storage.

8. The test device of claim 4, wherein said self-test data loading means further comprises:

a self-test data storage for storing the self-test data received from the microcomputer, said self-test data storage outputting the self-test data when said digital processing means inputs a clock signal into said self-test data storage in response to the control signal from said start flag setter; and a second multiplexer coupled to said analog processing means, said self-test data storage and said self-test mode setter, said second multiplexer being switchable to select self-test data being outputted by said self-test data storage in accordance with said test mode data of said self-test mode setter.

9. The test device of claim 4, wherein said analog and digital processing means are connected for testing failures in analog parts of the test device based upon the comparison of the input signal and the reference signal.

10. A method of testing failures of an analog-to-digital converter contained in a microcomputer, the method comprising the steps of:

a) comparing an input signal with a reference signal;

b) converting an output signal, based on the step of comparing the input signal and the reference signal, into digital data; and c) testing failures in digital parts of the analog-to-digital converter, the step of testing failures comprising converting self-test data into digital data and comparing self-test data with self-test data which has been converted into the digital data in place of the output signal, wherein said step of testing failures comprises i) storing test mode data from the microcomputer, and ii) setting a start flag upon receiving a start signal from the microcomputer and outputting a control signal to the digital processing means.

11. The method of claim 10, wherein the step of comparing the input signal with the reference signal comprises:

storing analog input select data received from the microcomputer;

selecting one of a plurality of input signals at input terminals of a first multiplexer in accordance with the analog input select data;

converting reference data from the digital processing means into the reference signal; and comparing the input signal with the reference signal.

12. The method of claim 10, wherein the step of converting the output signal into digital data comprises:

storing A/D conversion period data from the microprocessor;

generating control signals to enable the analog processing means and said self-test data loading means;

converting the A/D conversion period data into reference data used for the reference signal; and converting the self-test data from said self-test data loading means or the output signal from said analog processing means into digital data.

13. The method of claim 12, wherein said step of converting the output signal into digital data further comprises:

storing the digital data as A/D conversion result data and the reference data; and generating an interrupt signal upon completion of storing the digital data as A/D conversion result data.

14. The method of claim 10, wherein said step of testing failures further comprises:

storing the self-test data received from the microprocessor; and outputting the self-test data when the digital processing means generates a clock signal in response to the control signal.

15. The method of claim 10, wherein said steps of comparing and converting tests failures in analog parts of the test device.

* * * * *